United States Patent
Kozintsev (10) Patent No.: US 9,160,363 B2
(45) Date of Patent: Oct. 13, 2015

(54) RUN LENGTH ENCODING WITH NON-SEQUENTIAL INPUT

(71) Applicant: SAMSUNG DISPLAY CO., LTD., Yongin, Gyeonggi-Do (KR)

(72) Inventor: Igor Kozintsev, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/629,415

(22) Filed: Feb. 23, 2015

(65) Prior Publication Data

US 2015/0244396 A1    Aug. 27, 2015

Related U.S. Application Data

(60) Provisional application No. 61/945,744, filed on Feb. 27, 2014.

(51) Int. Cl.
```
H03M 7/00      (2006.01)
H03M 7/46      (2006.01)
H03M 7/48      (2006.01)
G06F 3/041     (2006.01)
```

(52) U.S. Cl.
CPC ...... *H03M 7/46* (2013.01); *H03M 7/48* (2013.01); *G06F 3/041* (2013.01)

(58) Field of Classification Search
CPC ............ H03M 7/46; H03M 7/48; G06F 3/041

USPC ......................................................... 341/59
See application file for complete search history.

(56) References Cited

U.S. PATENT DOCUMENTS

| | | | |
|---|---|---|---|
| 6,737,993 B2 * | 5/2004 | Watson | 341/59 |
| 6,897,793 B1 * | 5/2005 | Kim et al. | 341/59 |
| 6,954,157 B2 | 10/2005 | Kadno et al. | |
| 7,385,533 B2 * | 6/2008 | Sawada et al. | 341/58 |
| 7,483,585 B2 * | 1/2009 | Brakus, Jr. | 382/245 |
| 7,689,048 B2 | 3/2010 | Matsumoto et al. | |
| 2011/0116721 A1 | 5/2011 | Choi et al. | |

* cited by examiner

*Primary Examiner* — Brian Young
(74) *Attorney, Agent, or Firm* — Christie, Parker & Hale, LLP (57) ABSTRACT

A method for updating a run length encoded (RLE) stream includes: receiving an element having an insertion value to be inserted into the RLE stream at an insertion position, the insertion value having one of a plurality of values, the RLE stream having elements arranged in runs, and each of the elements having one of the values; identifying a run containing the insertion position; determining whether the insertion value is the same as the value of the element at the insertion position; when the insertion value is different from the value of the element at the insertion position: determining whether the insertion position is adjacent to one or more matching runs of the runs, each element of the matching runs having a same value as the insertion value; and extending one of the matching runs when the insertion position is adjacent to only one of the matching runs.

18 Claims, 10 Drawing Sheets

RUN LENGTH ENCODING WITH NON-SEQUENTIAL INPUT

This application claims priority to and the benefit of U.S. Provisional Patent Application No. 61/945,744, entitled "Run Length Encoding with Non-Sequential Input," filed in the United States Patent and Trademark Office on Feb. 27, 2014, the entire disclosure of which is incorporated herein by reference.

BACKGROUND

1. Field

Embodiments of the present invention relate to systems and methods for encoding and decoding data in a communications channel.

2. Related Art

Run Length Encoding (RLE) is a popular lossless compression technique that represents data elements by "runs"—number of elements that have the same value in a certain scan order. For example, the following sequence "0,0,0,1,1,1,0,0,0,1,1" can be represented by "(0,3), (1,3), (0,3), (1,2)" where first number in each pair determines the value of the elements of the run and the second number determines the number of repetitions of that value. In the above example, the sequence starts with three 0s (0,3) followed by three 1s (1,3), followed by three more 0s (0,3), and finally two 1s (1,2). In the binary case, values of the elements can be omitted and the representation becomes "(3,3,3,2)" where first number of the RLE sequence refers to the number of repetitions of the element "0".

Run length encoding is often used with hardware that operates in a raster-scan order such as display devices and scanners. The efficiency of RLE depends on characteristics of the data. For example, RLE provides higher compression when the number of different values is small and when the same values are often repeated in groups of adjacent elements. RLE can be applied to multidimensional data by applying a linear scan order on the data or by encoding number of repetitions directly in multiple dimensions. Typically, a RLE encoder operates on data that is provided in sequential order and stored in a line buffer or other types of memory. If data is produced in a non-sequential order, then the non-sequential data is generally buffered to complete the data so that it can be provided to the RLE encoder in sequential order.

SUMMARY

Aspects of embodiments of the present invention relate to a non-sequential run length encoding apparatus.

According to one embodiment of the present invention, a method for updating a run length encoded stream includes: receiving, by a processor, an element having an insertion value to be inserted into the run length encoded stream at an insertion position, the insertion value having one of a plurality of values, the run length encoded stream having a plurality of elements arranged in a plurality of runs located between a starting position and an ending position of the run length encoded stream, and each of the elements having one of the plurality of values and a position in the run length encoded stream; identifying a run of the runs of the run length encoded stream containing the insertion position; determining, by the processor, whether the insertion value is the same as the value of the element at the insertion position; when the insertion value is different from the value of the element at the insertion position: determining, by the processor, whether the insertion position is adjacent to one or more neighboring matching runs of the runs of the run length encoded stream, each element of the neighboring matching runs having a same value as the insertion value; extending, by the processor, one matching run of the one or more neighboring matching runs when the insertion position is adjacent to only one of the one or more neighboring matching runs; merging, by the processor, two matching runs of the one or more neighboring matching runs when the insertion position is adjacent to the two matching runs of the one or more neighboring matching runs; and creating, by the processor, a new run when the insertion position is not adjacent to the one or more neighboring matching runs.

The determining whether the insertion position is adjacent to one or more neighboring matching runs may include: calculating, by the processor, one or more distances from the insertion position to each of the one or more neighboring matching runs, each of the one or more neighboring matching runs having a left end and a right end; when the insertion position is between two of the one or more neighboring matching runs, calculating, by the processor, a left distance to the right end of a first neighboring matching run of the one or more neighboring matching runs; and a right distance to the left end of a second neighboring matching run of the one or more neighboring matching runs; when the insertion position is between one of the one or more neighboring matching runs and the starting position, calculating, by the processor, a left distance to the starting position and a right distance to the left end of the one run of the one or more neighboring matching runs; and when the insertion position is between one of the one or more neighboring matching runs and the ending position, calculating, by the processor, a left distance to the right end of the one run of the one or more neighboring matching runs and a right distance to the ending position.

The determining, by the processor, whether the insertion position is adjacent one or more neighboring matching runs may include: determining, by the processor, that the insertion position is adjacent only one neighboring matching run: when the left distance is greater than 1 and the right distance is 1; or when the left distance is 1 and the right distance is greater than 1; determining, by the processor, that the insertion position is between two matching runs when the left distance is 1 and the right distance is 1; and determining, by the processor, that insertion position is not adjacent to one or more matching runs when the left distance is greater than 1 and the right distance is greater than 1.

The plurality of values may include two values.

The plurality of values may include three values.

The identifying the run of the run length encoded stream containing the insertion position may include: predicting the run of the run length encoded stream in accordance with one or more previously received elements.

The element may include a plurality of consecutive elements, each of the consecutive elements having the insertion value, and wherein the insertion position includes a plurality of consecutive positions, the method further including replacing values at positions of the run length encoded stream corresponding to the plurality of consecutive positions with a value different from the value of the consecutive elements.

The run length encoded sequence may be padded with an additional run having zero length.

The merging two matching runs may include converting the additional run into a run having a non-zero length.

According to one embodiment of the present invention, a system includes: a touch controller; and a run length encoder coupled to the touch controller, the run length encoder being configured to: receive, from the touch controller, an element having an insertion value to be inserted into a run length encoded stream at an insertion position, the insertion value having one of a plurality of values, the run length encoded stream having a plurality of elements arranged in a plurality of runs located between a starting position and an ending position of the run length encoded stream, and each of the elements having one of the plurality of values and a position in the run length encoded stream; identify a run of the runs of the run length encoded stream containing the insertion position; determine whether the insertion value of the element is the same as the value at the insertion position; when the insertion value is different from the value of the element at the insertion position: determine whether the insertion position is adjacent to one or more neighboring matching runs of the run length encoded stream, each element of the neighboring matching runs having a same value as the insertion value; extend one matching run of the one or more neighboring matching runs when the insertion position is adjacent to only one of the one or more neighboring matching runs; merge two matching runs of the one or more neighboring matching runs when the insertion position is adjacent to the two matching runs of the one or more neighboring matching runs; and create a new run when the insertion position is not adjacent to one or more neighboring matching runs.

The run length encoder may be configured to determine whether the insertion position is adjacent to one or more neighboring matching runs by: calculating one or more distances from the insertion position to each of the one or more neighboring matching runs, each of the one or more neighboring matching runs having a left end and a right end; when the insertion position is between two of the one or more neighboring matching runs, calculating a left distance to the right end of a first run of the one or more neighboring matching runs; and a right distance to the left end of a second run of the one or more neighboring matching runs; when the insertion position is between one of the one or more neighboring matching runs and the starting position, calculating a left distance to the starting position and a right distance to the left end of the one run of the one or more neighboring matching runs; and when the insertion position is between one of the one or more neighboring matching runs and the ending position, calculating a left distance to the right end of the one run of the one or more neighboring matching runs and a right distance to the ending position.

The run length encoder may be configured to determine whether the insertion position is adjacent one or more neighboring matching runs by: determining that the insertion position is adjacent only one neighboring matching run: when the left distance is greater than 1 and the right distance is 1; or when the left distance is 1 and the right distance is greater than 1; determining that the insertion position is between two matching runs when the left distance is 1 and the right distance is 1; and determining that insertion position is not adjacent to one or more matching runs when the left distance is greater than 1 and the right distance is greater than 1.

The plurality of values may include two values.

The plurality of values may include three values.

The run length encoder may be configured to identify the run of the run length encoded stream containing the insertion position by: predicting the run of the run length encoded stream in accordance with one or more previously received elements.

The element may include a plurality of consecutive elements, each of the consecutive elements having the insertion value, wherein the insertion position includes a plurality of consecutive positions, and wherein the run length encoder is further configured to replace values at positions of the run length encoded stream corresponding to the plurality of consecutive positions with a value different from the value of the consecutive elements.

The run length encoded sequence may be padded with an additional run having zero length.

The run length encoder may be configured to merge runs by converting the additional run into a run having a non-zero length.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, only certain exemplary embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration. As used herein, the terms "use," "using," and "used" may be considered synonymous with the terms "utilize," "utilizing," and "utilized," respectively. When a first element is described as being "coupled" or "connected" to a second element, the first element may be directly "coupled" or "connected" to the second element, or one or more other intervening elements may be located between the first element and the second element.

Aspects of embodiments of the present invention relate to a non-sequential run length encoding apparatus. When used in combination with a non-sequential data source such as a 2D drawing engine for touch screen or stylus operation, embodiments of the present invention enable the performance of run length encoding of the data with reduced storage requirements and reduced hardware cost.

Aspects of embodiments of the present invention are directed to systems and methods for performing run length encoding to allow element-by-element encoding in an arbitrary order. Other aspects of embodiments of the present invention relate to encoding multiple consecutive elements at a time to reduce computational complexity of the run length encoding process. Furthermore, aspects of embodiments of the present invention involve reduced or minimal memory size for input data (e.g., for buffering the input data) and allow for an engineering trade-off between memory size and computational complexity.

Figure 1:
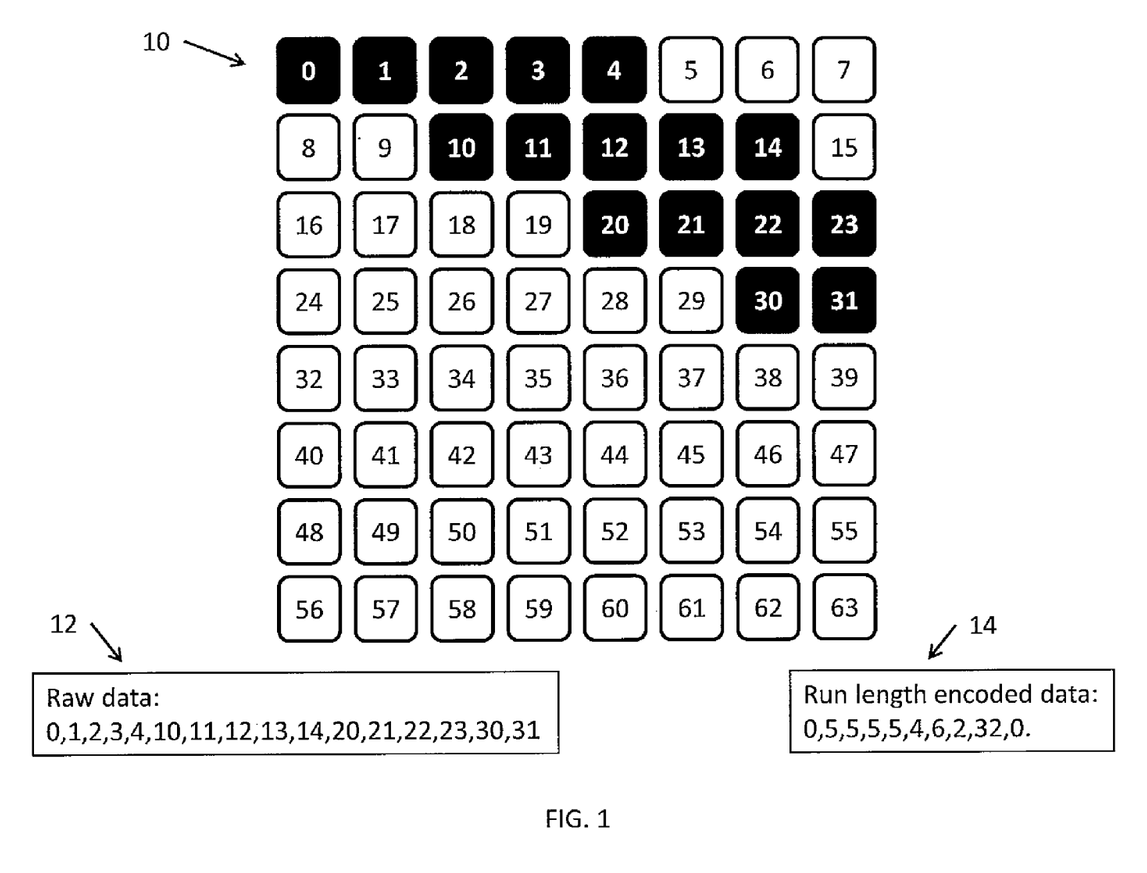
FIG. 1 is a schematic diagram illustrating raw data and the same data compressed with run length encoding.

Run length encoding (RLE) is a lossless compression technique that represents data elements by "runs"—number of elements that have same value in a certain scan order. FIG. 1 is a schematic diagram illustrating raw data and the same data compressed with run length encoding. As shown in FIG. 1, an input 2D binary array 10 includes highlighted locations (e.g., filled in black with white numbers) representing "1" and other locations (e.g., filled in white with black numbers) representing "0." Such a 2D binary array may be, for example, touch sensor data corresponding to locations on a touch sensitive panel that have been touched by a user.

In a raster scan order (line-by-line, starting from the top left element) all elements of the input array are assigned indices as shown in FIG. 1 (as shown in FIG. 1, the sixty four elements of the array 10 are labeled with indices from 0 to 63). Sequential input sequence 12 below and to the left of the array 10 represents the order of indices of elements with value "1" as they enter an RLE encoder. Resulting RLE sequence 14 is shown below and to the right of the array 10 as the sequence (0,5,5,5,5,4,6,2,32,0)—where the first "0" indicates that there are no elements with value "0" at the beginning of the sequence, the next "5" indicates that there are five elements with value "1", and so on. In this example, the values of the elements are omitted because the elements may have only one of two possible values (e.g., "0" or "1") and because of implicit order of "0" and "1" in the binary RLE sequence. However, embodiments of the present invention are not limited thereto and may be extended to circumstances where the elements may have a value selected from a set of more than two possible values (e.g., in the case of four possible values: "0", "1", "2", or "3").

When the input data for encoding is not organized in a sequential order, related art RLE encoders use additional memory to buffer the data in an intermediate stage and then sort the data sequentially before encoding. One example of such an application is a 2D drawing engine or application that translates coordinates of input touch events into pixels drawn on screen. Because the user may touch the various portions of the touch panel in a random order, the coordinates of the touch events do not necessarily appear in raster order. In this case, the related art RLE will require memory for the intermediate stage to store the data from the 2D drawing engine, thereby increasing the cost of such a system.

Figure 2:
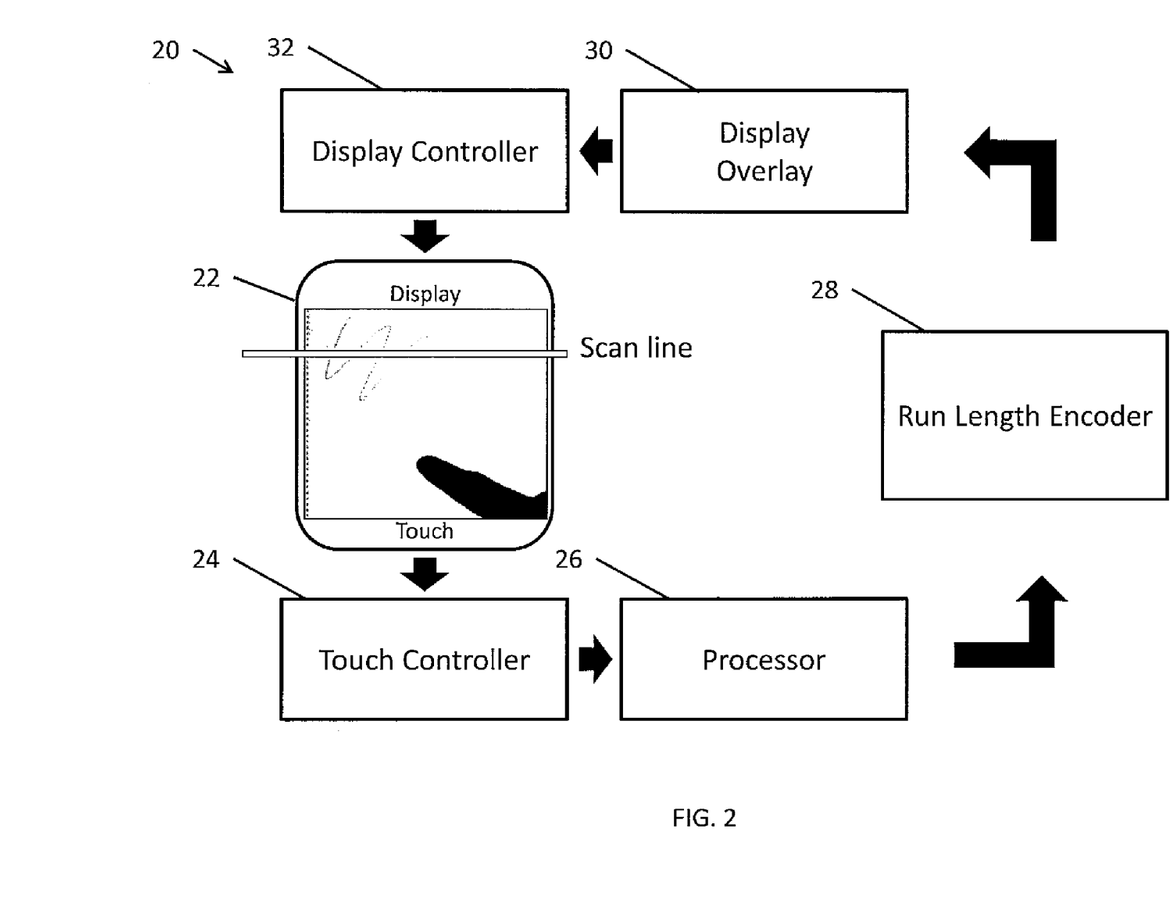
FIG. 2 is a block diagram illustrating a computing device including a run length encoder according to one embodiment of the present invention.

FIG. 2 is a block diagram illustrating the role of a run length encoder 28 in a system 20 according to one embodiment of the present invention. Referring to FIG. 2, a non-sequential RLE system and method can be used in an on-screen drawing system 20 (e.g., a computing device such as a tablet, smartphone, laptop, or other device having a touch screen interface) including a touch-enabled display 22, a touch controller 24, a processor 26 executing a 2D drawing algorithm, a run length encoder 28, display overlay (or low latency visual accelerator) 30, and a display controller 32 as shown in FIG. 2. In this example, the touch controller 24 receives touch events from the touch panel 22 and decodes the 2D positions of those touch events. The touch events are supplied to the processor 26 (in some embodiments, the processor 26 and the display overlay 30 may be the same component) and analyzed by a 2D drawing algorithm that produces a sequence of display coordinates representing a line to be shown on the display 22.

The order in which coordinates are produced by the 2D drawing algorithm does not necessarily correspond to a display scan order. For example, a display scan typically proceeds row by row from the top of the display to the bottom of the display with each row being scanned from left to right. However, a user may touch and drag on the touch-enabled display 22 along any direction other than the scan direction (e.g., a direction other than directly left to right) thereby generating touch events that arrive at the touch controller 24 and the processor 26 in an order different from the scan order and thereby causing the processor 26 to generate image data in an order different from the scan order.

According to embodiments of the present invention, the run length encoder 28 is used to encode positions of line pixels into a compact representation that is passed to the display overlay 30 that decodes the RLE stream and composites the final image drawn on the display 22 by the display controller 32. The run length encoder 28 according to embodiments of the present invention may be implemented in a variety of ways such as program instructions stored in memory and executed by a general purpose processor, a field programmable gate array (FPGA) configured to perform the run length encoding operations, or an application specific integrated circuit (ASIC) designed to perform the run length encoding operations. Also, according to certain embodiments, the display 22 may be an organic light-emitting diode (OLED) display or a liquid crystal display (LCD).

Figure 3A:
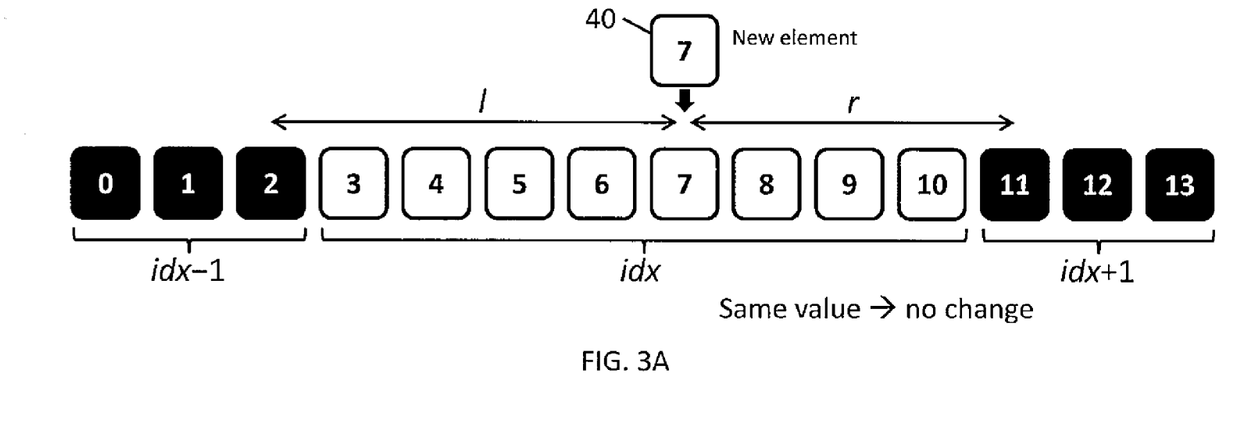
FIGS. 3A, 3B, 3C, 3D, and 3E are schematic illustrations of different cases in which an existing sequence of data is modified with the adding of a new element according to one embodiment of the present invention.

FIGS. 3A, 3B, 3C, 3D, and 3E are schematic illustrations of methods of adding a new element to run length encoded sequence of binary data in various circumstances according to one embodiment of the present invention. The sequence of binary data includes a plurality of elements, where each element may have one of two values (e.g., 0 and 1) and where each element is located at a particular position (or index) in the sequence. In non-binary situations, the elements may have one of a plurality of values. For example, in a sequence of 2-bit data, each of the elements of the sequence may have one of four values and in a sequence of 8-bit (one byte) data, each of the elements of the sequence may have one of 256 values. A new element having a value (or insertion value) may be added to the sequence at an insertion position within the sequence to replace the existing element already located at that insertion position in the sequence. For the purposes of the below discussion, positions in the sequences illustrated in FIGS. 3A, 3B, 3C, 3D, 3E, and 3F having white or unshaded squares are referred to as having the value "0" and shaded or black positions in the sequence will be considered as having the value "1". FIGS. 3A, 3B, 3C, 3D, and 3E illustrate a sample sequence of 14 binary values with indices 0 through 13. The example sequence shown in FIG. 3A has values 11100000000111 and therefore includes three runs and, when run length encoded, may be represented as: (0,3,8,3). As shown in FIG. 3A, a new element 40 having value (or "insertion value") "0" is being added to the sequence at position (or index) 7 to replace the existing element at position 7. The new element 40 is added to the sequence at position 7, which is in the run idx of eight 0 values. Run 0 is adjacent to runs idx−1 and idx+1.

The new element 40 has a value that matches the values of the elements of runs idx−1 and idx+1. As such, run idx−1 may be considered a first neighboring matching run and run idx+1 may be considered a second neighboring matching run (e.g., as shown in FIG. 3A, the new element 40, and runs idx−1 and idx+1 all have the same matching value "0"). In the case of binary sequences, adjacent runs will have the same value as the insertion value. However, in the non-binary case, the adjacent runs idx−1 and idx+1 do not necessarily have the same value as the insertion value. The distance l from the insertion position 7 to the right end of run idx−1 (the run to the left of the run idx) is 5 and the distance r from the insertion position 7 to the left end of run idx+1 (the run to the right of the second run) is 4.

Figure 4:
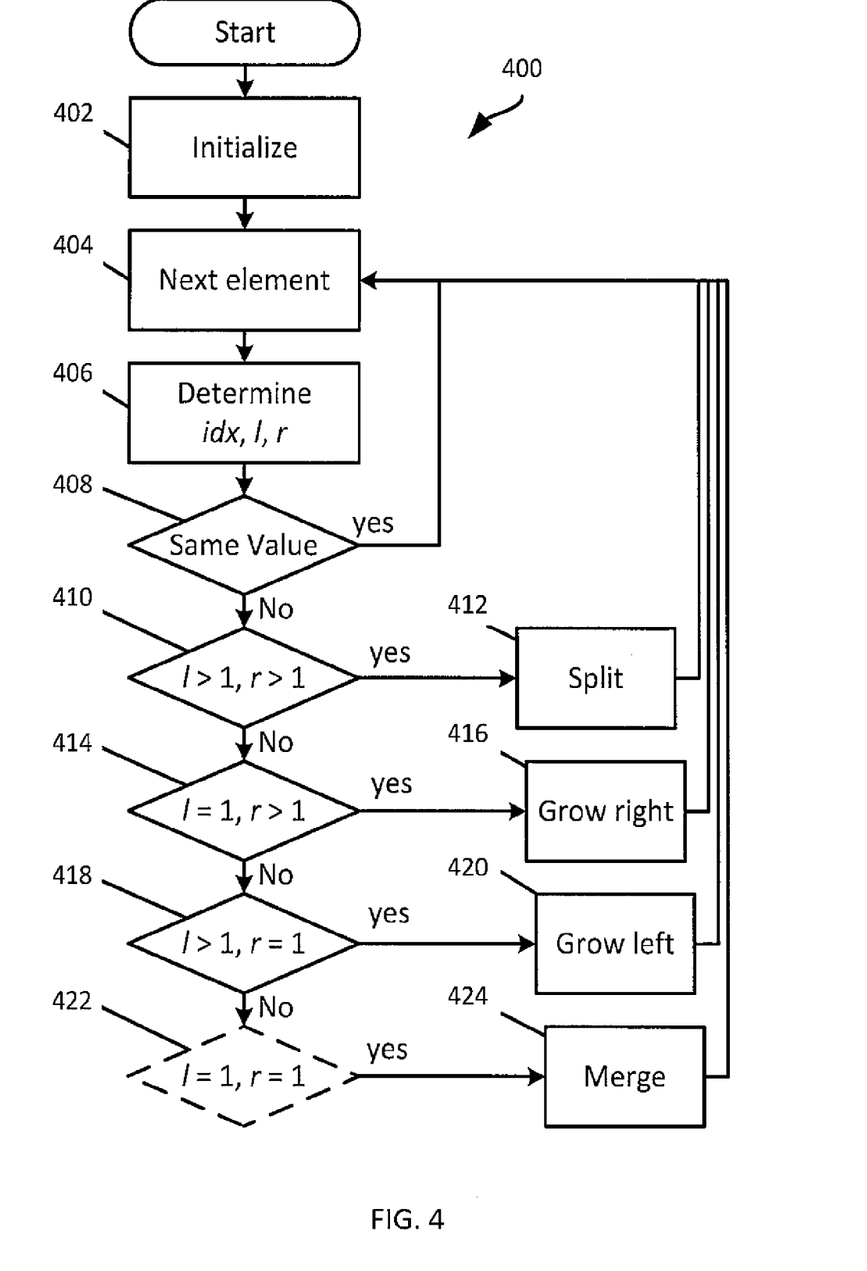
FIG. 4 is a flowchart illustrating a method for adding a new element to run length encoded data according to one embodiment of the present invention.

FIG. 4 is a flowchart illustrating a method 400 for adding a new element to run length encoded binary data according to one embodiment of the present invention. Embodiments of the present invention in which the elements have more than two different values will be described in more detail below.

Referring to FIG. 4, in operation 402, the method of updating values of a run length encoded sequence is initialized by generating a run length encoded sequence from existing data or from a default value (e.g., a sequence where all the values are 0), where the sequence has a plurality of indexed positions. In the examples shown in FIGS. 3A, 3B, 3C, and 3D, the initial run length encoded sequence is (0,3,8,3).

Assuming there is a collection of elements to be inserted, in operation 404 the next element is selected to be inserted as a new element (e.g., new element 40 as illustrated in FIGS. 3B, 3C, 3D, 3E, and 3F). To insert the new element in operation 406, the run length encoder 28 identifies which run "idx" of the existing runs that the element falls into, based on the index (or indexed position or position) of the new element.

After determining the corresponding run, the run length encoder 28 determines the distance of the element to the right ("r") and left ("l") boundary of the run idx, where l is the number of positions in run idx between the position of the new element 40 and run idx−1 (e.g., the run to the left of, or having lower indices than, run idx) and where r is the number of indices in run idx between the index of the new element and run idx+1 (e.g., the run to the right of, or having higher indices than, run idx). If there is no such run to the left of run idx, then l represents the number of positions between the index of the new element 40 and the start of the sequence and if there is no such run to the right of run idx, then r represents the number of positions between the index of the new element 40 and the end of the sequence. This operation may be performed immediately after identifying the corresponding index or after operation 408.

In operation 408, the run length encoder 28 determines whether the value of the new element 40 is the same as the values of the elements in the run idx. If so, then the new element 40 does not make any change to the run length encoded sequence and the run length encoder returns to in operation 404 to select the next element for insertion. For example, as shown in FIG. 3A, because the value of the new element 40 is "0" (as signified by the white square) and it is to be inserted at index 7, which is already a "0" value, no change needs to be made to the existing sequence.

If the new element 40 has a value different from the values run idx, then there are four different cases for handling the insertion of the new element that depend on the distance of the element to the right ("r") and left ("l") boundary of the run, as illustrated in FIGS. 3B, 3C, 3D, and 3E. In the below discussion, an element is "adjacent" to a "neighboring run" (e.g., the closest runs to the current run idx that have the same value as the element) when the distance to the neighboring run is 1 (e.g., l=1 or r=1). When the distance to the neighboring run is greater than 1, then it is not adjacent to the neighboring run.

Figure 3B:
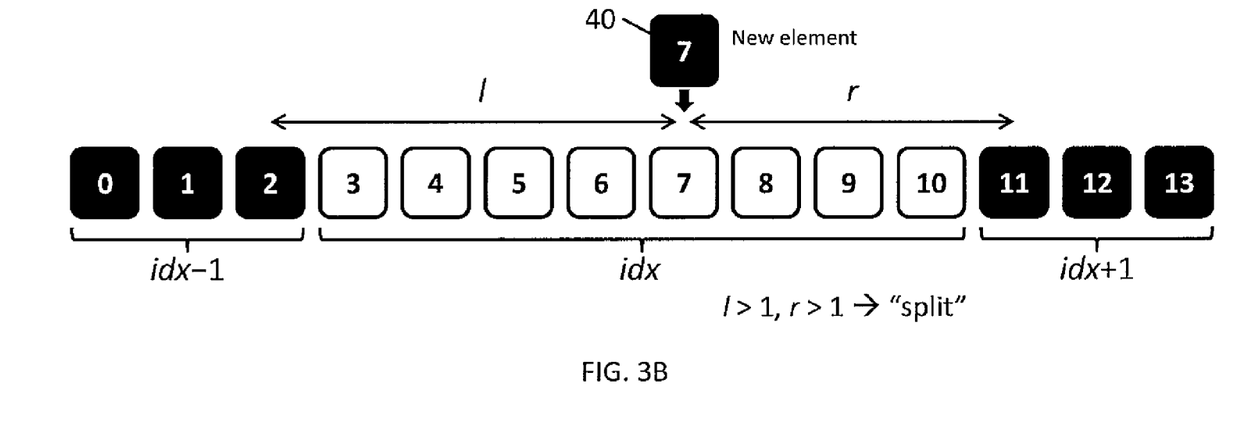

If the run length encoder determines in operation 410 that element inserted into "idx" is not adjacent to any existing runs (l>1, r>1), as shown in FIG. 3B, then in operation 412 the current run idx is "split" and two additional runs are created (the existing run is reduced in size). In this situation, the existing run length encoded stream needs to be shifted from the position of the new element. As such, the run length encoded sequence is updated from (0,3,8,3) to (0,3,4,1,3,3) because the original run of eight 0s is broken into a run of four 0s, a run of one 1, and a run of three 0s.

Figure 3C:
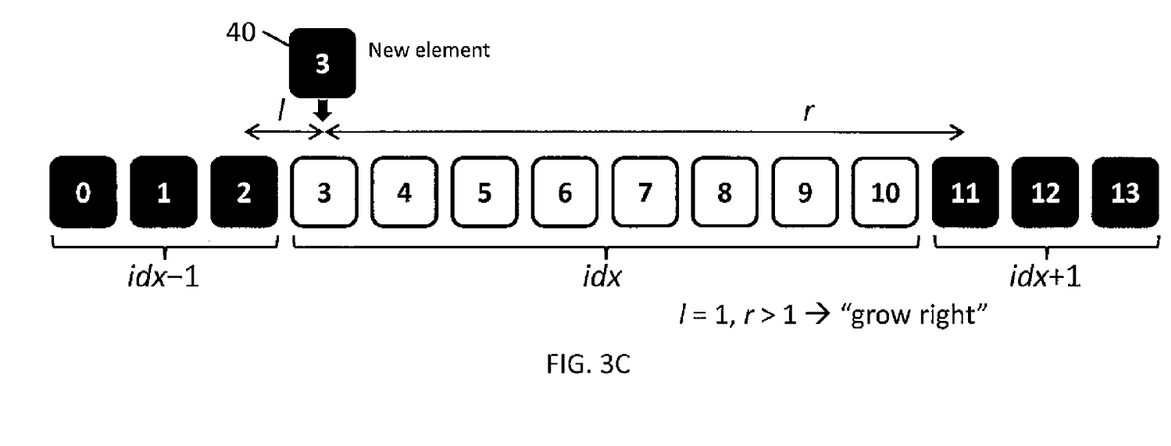

If the new element 40 is not more than 1 unit away from the neighboring runs on both sides, then in operation 414, the run length encoder 28 determines whether the new element 40 is only adjacent to an existing run having the same value on the left (l=1, r>1), as illustrated, for example, in FIG. 3C. If so, then in operation 416 the run length encoder 28 grows (or increments or "grows right") the adjacent left run idx−1 and shrinks (or decrements) the current run idx.

In the example shown in FIG. 3C, the run length encoder 28 attempts to add new element 40 having a value "1" at position 3 into the existing encoded sequence. Because position 3 is adjacent the run having value "1" and length three in positions 0 through 2, the new element 40 is adjacent a run of the same value. As such, the left run idx−1 is converted into a run having value "1" and length 4 and the run of value "0" and length 8 that the element was inserted into is reduced to a run of length 7. As such, the run length encoded sequence is updated from (0,3,8,3) to (0,4,7,3).

If the new element is not adjacent to a run on the left, then in operation 418, the run length encoder determines if the new element 40 is only adjacent an existing run having the same value on the right. If so, then in a manner similar to the "grow right" operation 416, the run length encoder 28 grows (or increments or "grows left") the existing run on the right (idx+1) in operation 420.

Figure 3D:
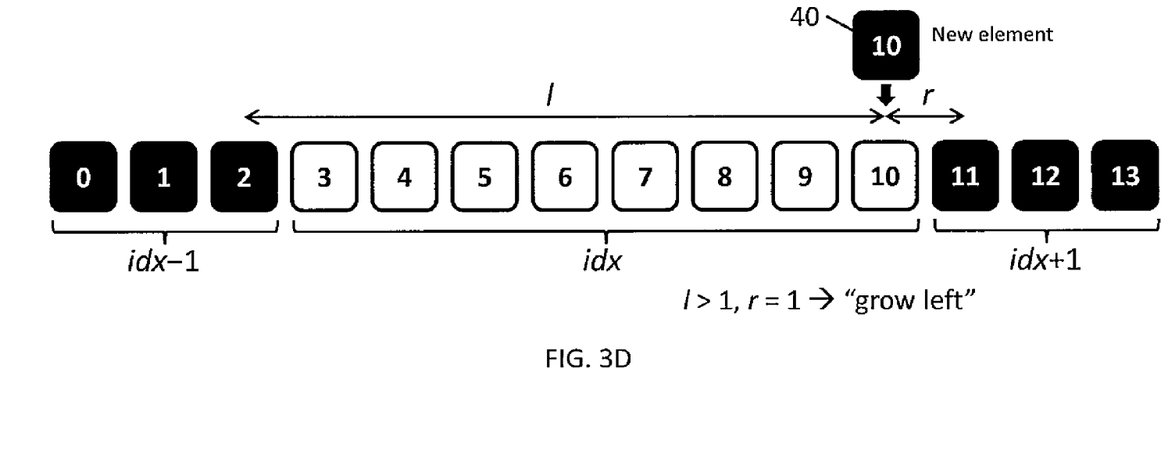
Figure 3E:
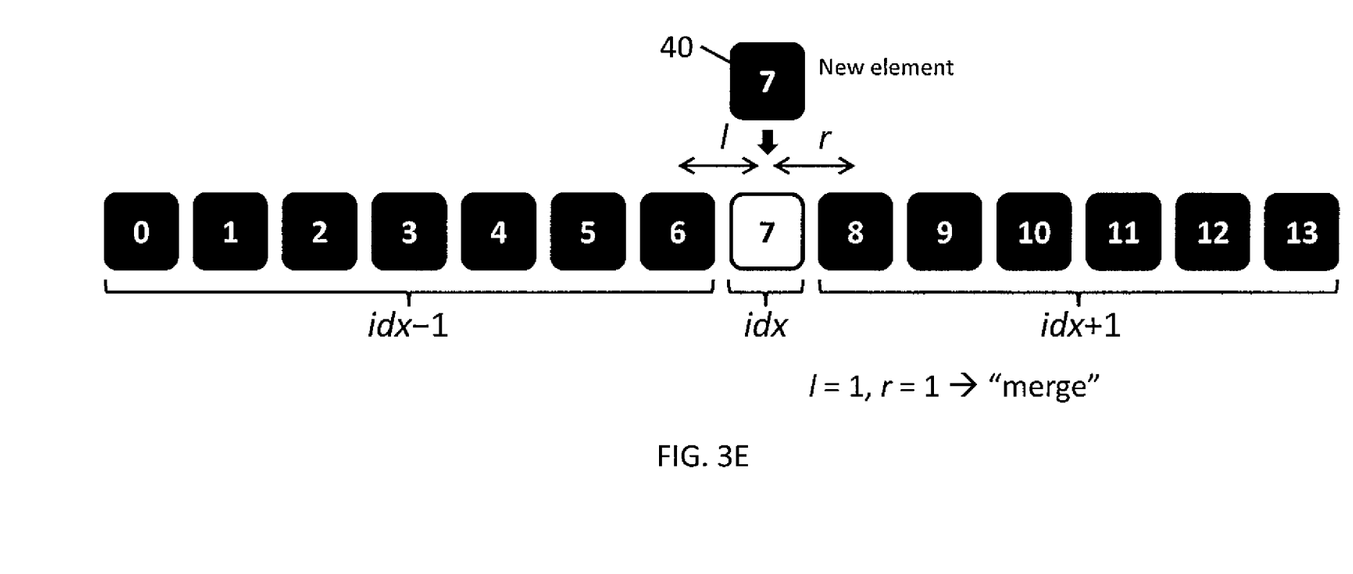

Referring to FIG. 3D, when the new element 40 is adjacent to an existing run on the right (l>1, r=1), then the adjacent run to the right (idx+1) is incremented while the run "idx" is decremented. As such, the run length encoded sequence is updated from (0,3,8,3) to (0,3,7,4).

If the run length encoder 28 determines in operation 422 that the new element 40 is adjacent to two runs having the same value as the new element 40, then in operation 424 the two runs are "merged" and the total number of runs is reduced by two. In this case the runs after being merged can be shifted to the left or padded with "0". In the example shown in FIG. 3E, the original sequence is 1111111011111 which may be represented as an RLE sequence as (0,7,1,5). Replacing the value 0 at index 7 of the sequence with a value 1 converts the sequence into a sequence of thirteen 1s which may be represented, without padding, as the RLE sequence (0,13). Alternatively, if the run length encoded sequence is padded with 0, then the resulting RLE sequence would be (0,13,0,0). The block diagram of the method as shown in FIG. 4 where the last condition check 422 is shown for clarity and technically not required since this is the only remaining possible case in the binary scenario and therefore could be handled by an "else" condition.

According to one embodiment of the present invention, the non-sequential run length encoder 28 is generalized to operate on multiple consecutive, same valued elements at a time. The elements to be inserted may already be ordered consecutively or may be sorted on arrival. As such, the non-sequential run length encoder 28 may group together consecutive elements and merge them with the run length encoded sequence in a reduced number of operations.

FIGS. 5A, 5B, 5C, 5D, and 5E are schematic illustrations of methods of adding multiple new elements 42 to run length encoded binary data in various circumstances according to one embodiment of the present invention. FIG. 6 is a flowchart illustrating a method 600 for adding a new element to run length encoded binary data according to one embodiment of the present invention. Descriptions of operations that are substantially similar to those described with respect to FIG. 4 will not be repeated in detail herein. In operation 602, in a manner similar to that of operation 402 illustrated in FIG. 4, the method of updating values of a run length encoded sequence is initialized by generating a run length encoded sequence from existing data or from a default value (e.g., a sequence where all the values are 0), where the sequence has a plurality of indexed positions. Assuming there is a collection of elements to be inserted, in operation 604, the next set of consecutive elements is selected to be inserted (e.g., new elements 42 as illustrated in FIGS. 5A, 5B, 5C, 5D, 5E, and 5F).

Figure 5A:
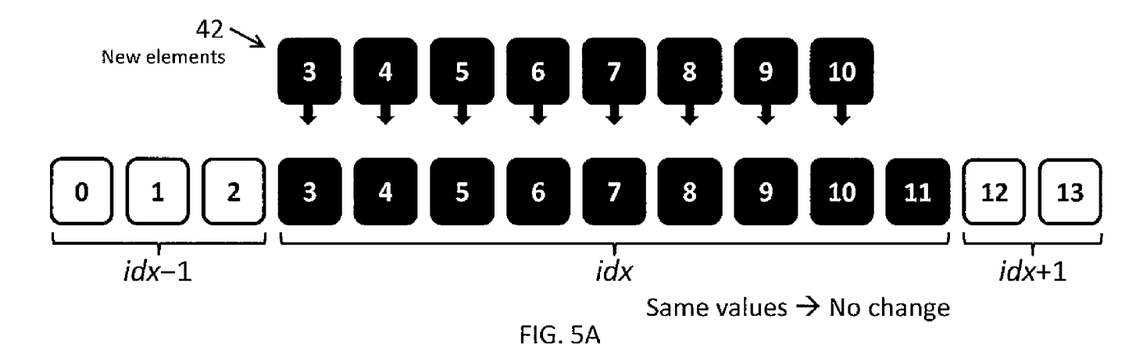
FIGS. 5A, 5B, 5C, 5D, 5E and 5F are schematic illustrations of methods of adding multiple new elements to run length encoded binary data in various circumstances according to one embodiment of the present invention.
Figure 6:
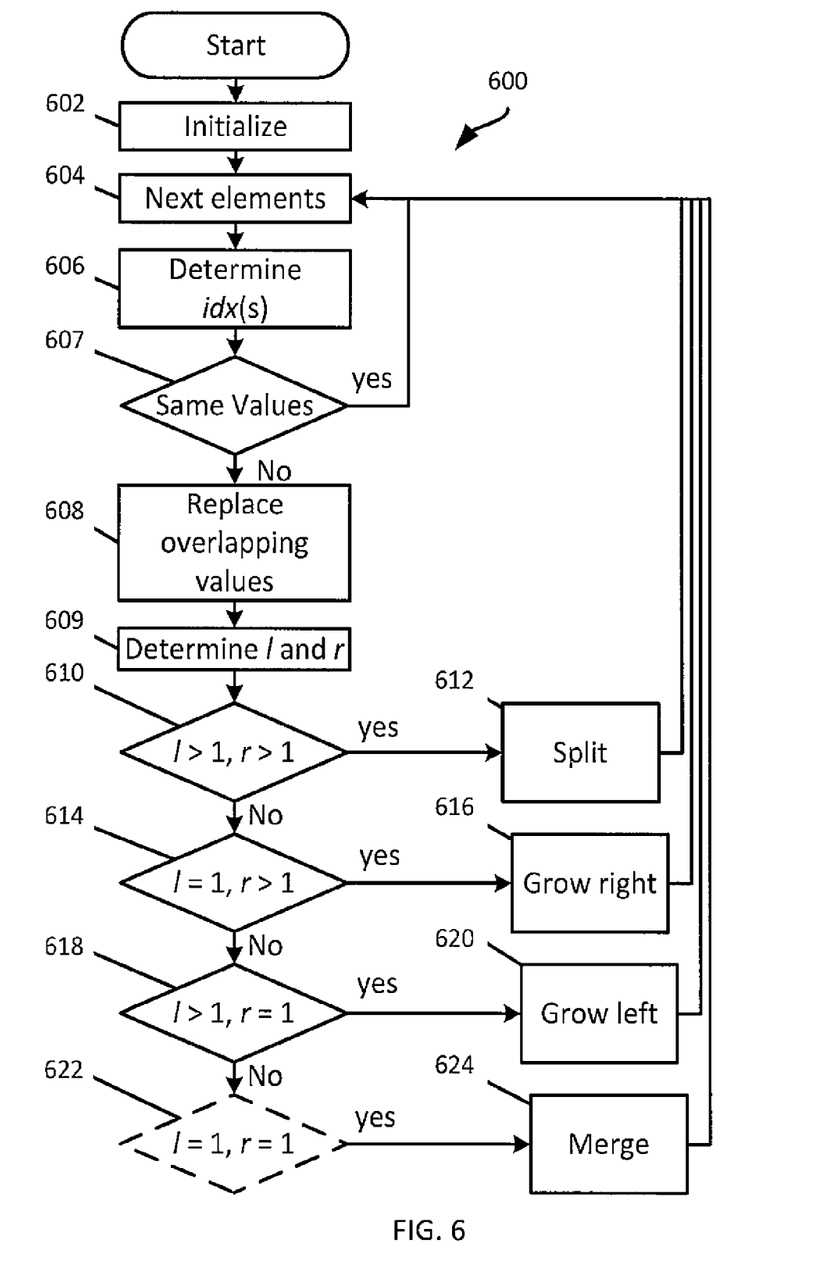
FIG. 6 is a flowchart illustrating a method for adding a new element to run length encoded binary data according to one embodiment of the present invention.

Referring to FIG. 5A, if additional new elements 42 having value 1 are to be added include at positions 3 through 10, then, according to one embodiment of the present invention, the new elements to be added at positions 3, 4, 5, 6, 7, 8, 9, and 10 could be grouped together and inserted in one operation.

Referring to FIG. 6, in operation 606, the non-sequential run length encoder 28 determines which run or runs "idx(s)" of the existing runs the new elements fall into, based on the indices (or indexed positions or positions) of the new elements.

In operation 607, the non-sequential run length encoder 28 determines whether the new elements have the same value as all of the positions of the run length encoded sequence. If so, then nothing needs to be done, as illustrated in FIG. 5A.

Figure 5B:
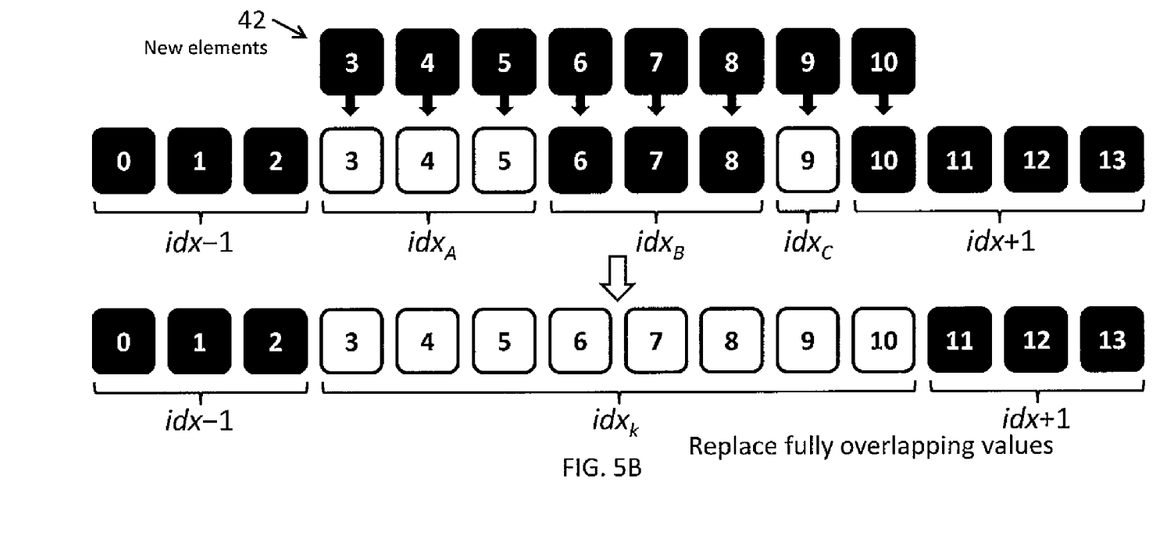

If not all of the existing positions have the same value as the new elements 42, then in one embodiment of the present invention, in operation 608, any overlapping values are replaced with a value different from the value of the new elements. For example, as illustrated in FIG. 5B, a run of seven "1" values is to be added at positions 3 through 10 of a run length encoded sequence 11100011101111, which may be expressed as an RLE sequence (0,3,3,3,1,4). As such, positions 3 through 10 already include a mix of "0" and "1" values in runs $idx_A$, $idx_B$, and $idx_C$ and in part of run idx+1. In one embodiment of the present invention, all of the positions to which the new elements are to be added are initially replaced with a value different from the value of the new elements to create a single run having length at least equal to the number of new elements. In some instances, this may cause the new run to merge with an adjacent run. In the example shown in FIG. 5B, runs $idx_A$, $idx_B$, and $idx_C$ are merged together and run idx+1 is reduced in size by 1 to create the temporary sequence 1110000000111, which may be expressed as the RLE sequence (0,3,7,3).

In other embodiments of the present invention, if some, but not all of the existing positions have the same value as the new elements 42, then the new elements 42 can be inserted one at a time, as described above with respect to FIG. 4. However, embodiments of the present invention are not limited to the particular techniques described herein.

After determining the corresponding runs and replacing the values to create the temporary sequence, if necessary, the run length encoder 28 determines, in operation 609, the distance of the new elements 42 to the right ("r") and left ("l") boundary of the run (e.g., the new run $idx_k$ of FIG. 5B, created from merging the runs $idx_A$, $idx_B$, and $idx_C$).

After determining the distances l and r, the remaining operations may proceed in a manner substantially similar to that provided above in the single element embodiments.

Figure 5C:
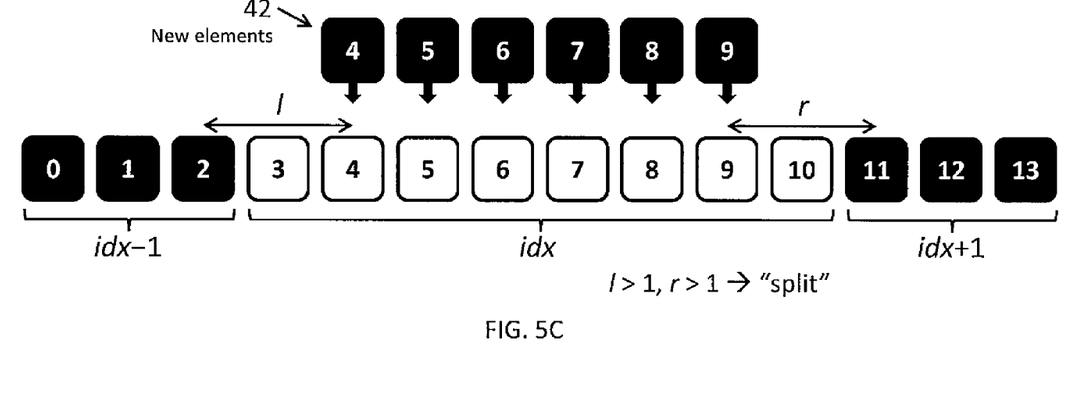

In operation 610, if l>1 and r>1, then, as shown in FIG. 5C, the run idx is split and two additional runs are created. In the example of FIG. 5C, given original RLE sequence (0,3,8,3), the length 8 run is split by the 6 new elements 42 at positions 4 through 9 in operation 612 and the new run length encoded sequence is (0,3,1,6,1,3). This allows reduced computational effort because, in the single element case, each of the new elements 42 would be inserted one at a time, thereby resulting in, for example, one split operation and five grow operations.

Figure 5D:
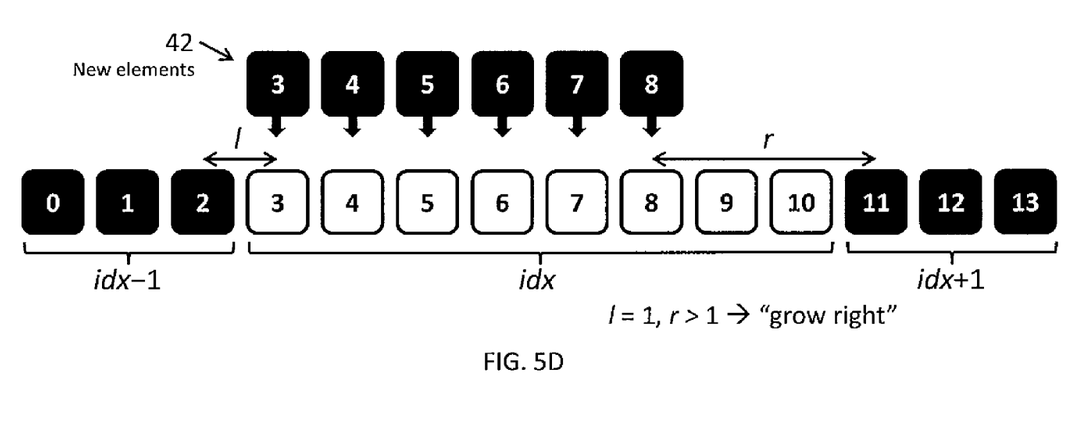

In operation 614, if l=1 and r>1, then, as shown in FIG. 5D, in operation 616 the left run idx−1 is grown to the right. In the example of FIG. 5D, given original RLE sequence (0,3,8,3) and the addition of 6 new elements 42 at positions 3 through 8, the left run idx−1 of length 3 is grown by 6 and the run idx of length 8 is shrunk by 6, thereby generating the new RLE sequence (0,9,2,3).

Figure 5E:
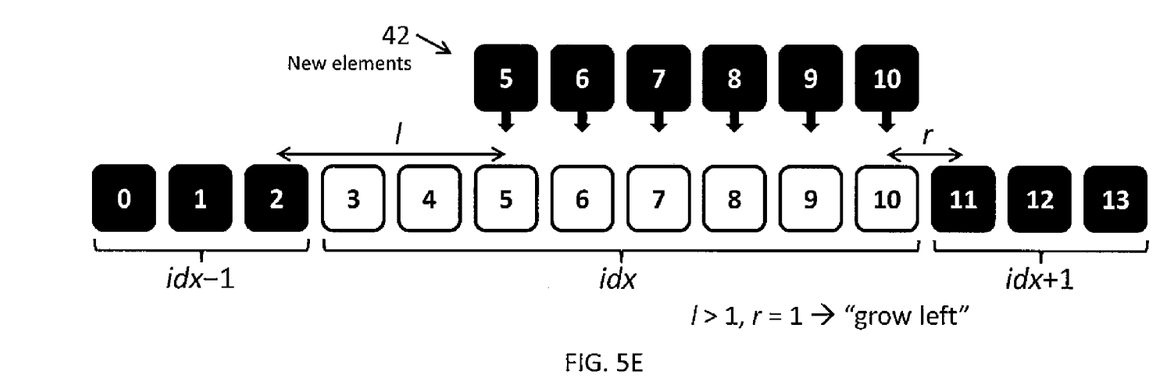

Similarly, in operation 618, if l>1 and r=1, then, as shown in FIG. 5E, in operation 620 the right run idx+1 is grown to the left. In the example of FIG. 5E, given original RLE sequence (0,3,8,3) and the addition of 6 new elements 42 at positions 5 through 10, the right run idx−1 of length 3 is grown by 6 and the run idx of length 8 is shrunk by 6, thereby generating the new RLE sequence (0,3,2,9).

Figure 5F:
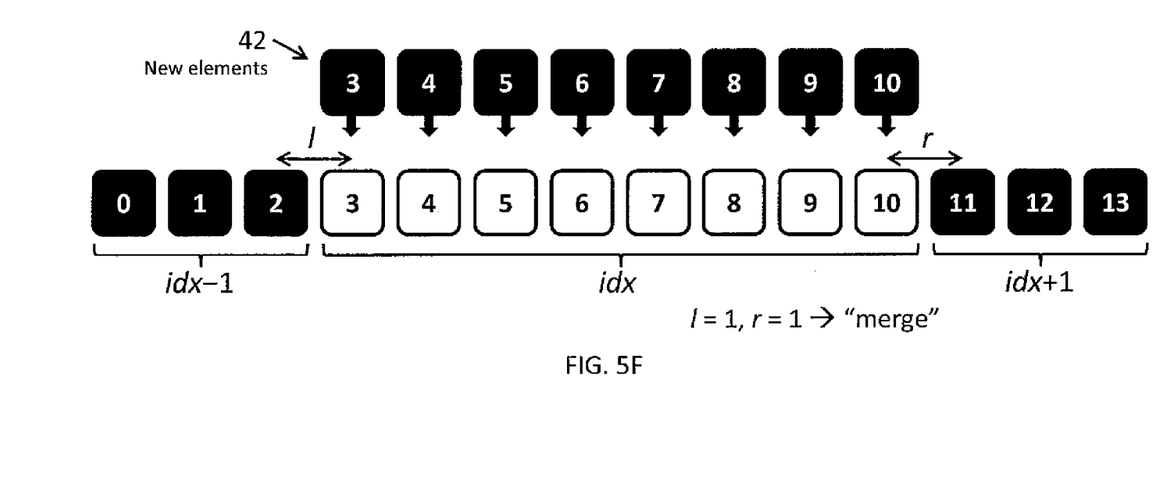

Finally, in operation 622, if l=1 and r=1, then, as shown in FIG. 5F, in operation 624 all three runs idx−1, idx, and idx+1 are merged together into a single run. In the example of FIG. 5F, given original RLE sequence (0,3,8,3) and the addition of 8 new elements 42 at positions 3 through 10, the three runs are merged to generate the new RLE sequence (0,13) or, when padded, (0,13,0,0).

In circumstances where the sequence is not binary (e.g., situations where the elements of the sequence have more than two possible values), the new element 40 is only merged into the adjacent runs when the adjacent run has the same value as the new element 40. Substantially the same techniques described above may be applied in the non-binary case, with the modification that the distances l and r are calculated as the distance to the nearest run having the same value as the new element 40. For example, in the non-binary case, the same "split" and "merge" operations may be used in substantially the same way, where "merge" in the non-binary case would be performed when both the left and right runs have the same value as the inserted element. The "grow left" and "grow right" operations would apply only to situations in which the neighboring run to the right or the neighboring run to the left, respectively, had the same value as the inserted element. An additional case would be introduced in the non-binary case, where a new run is created at the boundary of an existing run (e.g., where l=1 and r>1 and the value of the neighboring run to the left is different from the inserted value, where r=1 and l>1 and the value of the neighboring run to the right is different from the inserted value, or when l=1 and r=1 and the elements on the left and right are both different from the inserted value).

The different cases (non-adjacent, adjacent to the left, adjacent to the right, and adjacent to both the left and the right) may be evaluated in any order or in parallel and embodiments of the present invention are not limited to the order described herein.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

For example, in one embodiment, the search operation for location of the run containing element to be encoded can use prediction. One possibility of implementing the prediction is to start the search from the run containing last encoded symbol (or element), which may reduce the search time in embodiments where the new values are closely clustered together. Additionally, direction of search (e.g., left, right, up, or down) can be predicted based on the positions of one or more of the last encoded symbols.

In some embodiments of the present invention, the run length encoder 28 can trade-off memory and computational requirements by reducing amount of data shifts using additional zero-length intervals in the RLE sequence as generated during, for example, the initialization operation 402. Padding the initial RLE sequence with zeros between existing runs does not change the meaning of the sequence because a run of length zero indicates no elements having that value between those existing runs and consumes additional memory. However, if an existing run is split, then the existing adjacent location in the RLE sequence having a 0 may be used to represent one of the new runs generated by the split, thereby saving the computational effort of shifting all of the existing runs to the right. The trade-off for this additional computational efficiency is additional memory usage in the form of the unused zeros.

What is claimed is:

1. A method for updating a run length encoded stream, the method comprising:
   receiving, by a processor, an element having an insertion value to be inserted into the run length encoded stream at an insertion position, the insertion value having one of a plurality of values, the run length encoded stream having a plurality of elements arranged in a plurality of runs located between a starting position and an ending position of the run length encoded stream, and each of the elements having one of the plurality of values and a position in the run length encoded stream;
   identifying a run of the runs of the run length encoded stream containing the insertion position;
   determining, by the processor, whether the insertion value is the same as the value of the element at the insertion position;
   when the insertion value is different from the value of the element at the insertion position:
   determining, by the processor, whether the insertion position is adjacent to one or more neighboring matching runs of the runs of the run length encoded stream, each element of the neighboring matching runs having a same value as the insertion value;
   extending, by the processor, one matching run of the one or more neighboring matching runs when the insertion position is adjacent to only one of the one or more neighboring matching runs;
   merging, by the processor, two matching runs of the one or more neighboring matching runs when the insertion position is adjacent to the two matching runs of the one or more neighboring matching runs; and
   creating, by the processor, a new run when the insertion position is not adjacent to the one or more neighboring matching runs.

2. The method of claim 1, wherein the determining whether the insertion position is adjacent to one or more neighboring matching runs comprises:
   calculating, by the processor, one or more distances from the insertion position to each of the one or more neighboring matching runs, each of the one or more neighboring matching runs having a left end and a right end;
   when the insertion position is between two of the one or more neighboring matching runs, calculating, by the processor, a left distance to the right end of a first neighboring matching run of the one or more neighboring matching runs; and a right distance to the left end of a second neighboring matching run of the one or more neighboring matching runs;
   when the insertion position is between one of the one or more neighboring matching runs and the starting position, calculating, by the processor, a left distance to the starting position and a right distance to the left end of the one run of the one or more neighboring matching runs; and
   when the insertion position is between one of the one or more neighboring matching runs and the ending position, calculating, by the processor, a left distance to the right end of the one run of the one or more neighboring matching runs and a right distance to the ending position.

3. The method of claim 2, wherein the determining, by the processor, whether the insertion position is adjacent one or more neighboring matching runs comprises:
   determining, by the processor, that the insertion position is adjacent only one neighboring matching run:
   when the left distance is greater than 1 and the right distance is 1; or
   when the left distance is 1 and the right distance is greater than 1;
   determining, by the processor, that the insertion position is between two matching runs when the left distance is 1 and the right distance is 1; and
   determining, by the processor, that insertion position is not adjacent to one or more matching runs when the left distance is greater than 1 and the right distance is greater than 1.

4. The method of claim 1, wherein the plurality of values consists of two values.

5. The method of claim 1, wherein the plurality of values comprises three values.

6. The method of claim 1, wherein the identifying the run of the run length encoded stream containing the insertion position comprises:
   predicting the run of the run length encoded stream in accordance with one or more previously received elements.

7. The method of claim 1, wherein the element comprises a plurality of consecutive elements, each of the consecutive elements having the insertion value, and
   wherein the insertion position comprises a plurality of consecutive positions,
   the method further comprising replacing values at positions of the run length encoded stream corresponding to the plurality of consecutive positions with a value different from the value of the consecutive elements.

8. The method of claim 1, wherein the run length encoded sequence is padded with an additional run having zero length.

9. The method of claim 8, wherein the merging two matching runs comprises converting the additional run into a run having a non-zero length.

10. A system comprising:
a touch controller; and
a run length encoder coupled to the touch controller, the run length encoder being configured to:
receive, from the touch controller, an element having an insertion value to be inserted into a run length encoded stream at an insertion position, the insertion value having one of a plurality of values, the run length encoded stream having a plurality of elements arranged in a plurality of runs located between a starting position and an ending position of the run length encoded stream, and each of the elements having one of the plurality of values and a position in the run length encoded stream;
identify a run of the runs of the run length encoded stream containing the insertion position;
determine whether the insertion value of the element is the same as the value at the insertion position;
when the insertion value is different from the value of the element at the insertion position:
determine whether the insertion position is adjacent to one or more neighboring matching runs of the run length encoded stream, each element of the neighboring matching runs having a same value as the insertion value;
extend one matching run of the one or more neighboring matching runs when the insertion position is adjacent to only one of the one or more neighboring matching runs;
merge two matching runs of the one or more neighboring matching runs when the insertion position is adjacent to the two matching runs of the one or more neighboring matching runs; and
create a new run when the insertion position is not adjacent to one or more neighboring matching runs.

11. The system of claim 10, wherein the run length encoder is configured to determine whether the insertion position is adjacent to one or more neighboring matching runs by:
calculating one or more distances from the insertion position to each of the one or more neighboring matching runs, each of the one or more neighboring matching runs having a left end and a right end;
when the insertion position is between two of the one or more neighboring matching runs, calculating a left distance to the right end of a first run of the one or more neighboring matching runs; and a right distance to the left end of a second run of the one or more neighboring matching runs;
when the insertion position is between one of the one or more neighboring matching runs and the starting position, calculating a left distance to the starting position and a right distance to the left end of the one run of the one or more neighboring matching runs; and
when the insertion position is between one of the one or more neighboring matching runs and the ending position, calculating a left distance to the right end of the one run of the one or more neighboring matching runs and a right distance to the ending position.

12. The system of claim 11, wherein the run length encoder is configured to determine whether the insertion position is adjacent one or more neighboring matching runs by:
determining that the insertion position is adjacent only one neighboring matching run:
when the left distance is greater than 1 and the right distance is 1; or
when the left distance is 1 and the right distance is greater than 1;
determining that the insertion position is between two matching runs when the left distance is 1 and the right distance is 1; and
determining that insertion position is not adjacent to one or more matching runs when the left distance is greater than 1 and the right distance is greater than 1.

13. The system of claim 10, wherein the plurality of values consists of two values.

14. The system of claim 10, wherein the plurality of values comprises three values.

15. The system of claim 10, wherein the run length encoder is configured to identify the run of the run length encoded stream containing the insertion position by:
predicting the run of the run length encoded stream in accordance with one or more previously received elements.

16. The system of claim 10, wherein the element comprises a plurality of consecutive elements, each of the consecutive elements having the insertion value,
wherein the insertion position comprises a plurality of consecutive positions, and
wherein the run length encoder is further configured to replace values at positions of the run length encoded stream corresponding to the plurality of consecutive positions with a value different from the value of the consecutive elements.

17. The system of claim 10, wherein the run length encoded sequence is padded with an additional run having zero length.

18. The system of claim 17, wherein the run length encoder is configured to merge runs by converting the additional run into a run having a non-zero length.

* * * * *